United States Patent [19]
Kondo et al.

[11] Patent Number: 4,725,745
[45] Date of Patent: Feb. 16, 1988

[54] BI-MOS PLA

[75] Inventors: Shizuo Kondo; Setsuo Ogura; Eiji Minamimura, all of Takasaki; Makoto Furihata, Tamamura, all of Japan

[73] Assignee: Hitachi, Ltd., Tokyo, Japan

[21] Appl. No.: 643,260

[22] Filed: Aug. 22, 1984

[30] Foreign Application Priority Data

Aug. 22, 1983 [JP]  Japan ................... 58-151557
Nov. 11, 1983 [JP]  Japan ................... 58-210812

[51] Int. Cl.$^4$ .................. H03K 19/02; H03K 19/091; G06F 7/38
[52] U.S. Cl. ........................... 307/465; 307/446; 307/459; 307/477
[58] Field of Search ............... 307/446, 447, 459, 465, 307/466, 468, 477; 364/716; 340/825.83; 351/92, 43

[56] References Cited

PUBLICATIONS

"Low-Power Blended Transistor Logic Circuit", I.B.M. Tech. Disc. Bul., vol. 17, No. 10, Mar. 1975.

Primary Examiner—John S. Heyman
Assistant Examiner—M. R. Wambach
Attorney, Agent, or Firm—Antonelli, Terry & Wands

[57] ABSTRACT

An integrated programmable logic array formed within a single silicon chip comprises a combination of a logical product gate array and a logical summation gate array. The logical product gate array is equipped with a plurality of MIS field-effect transistors whose gates are selectively driven by a plurality of input signals. Source-drain paths of these transistors are connected in series. The logical summation gate array is equipped with a plurality of inverted bipolar transistors having collector-emitter paths which are connected in parallel.

9 Claims, 10 Drawing Figures

BI-MOS PLA

BACKGROUND OF THE INVENTION

This invention relates to a technique applied to semiconductor integrated circuits, and which is particularly effective when applied to a semiconductor integrated circuit provided with a logic array. For example, the present invention can be applied effectively to a PLA (Programmable Logic Array) consisting of a logical product (AND or NAND) gate array and a logical summation (OR or NOR) gate array.

The inventors of the present invention have clarified that the following problems are encountered in semiconductor integrated circuit techniques, particularly in PLA circuit techniques.

An outline of a PLA will first be given briefly. A PLA usually consists of a logical product gate array and a logical summation gate array. The logical product gate array typically first executes an AND (or NAND) operation for a plurality of logical inputs applied thereto from outside. Next the logical summation gate array executes an OR (or NOR) operation for a plurality of logical outputs produced from the logical product gate array. A logical output satisfying predetermined logic conditions can thus be obtained from the logical summation gate array. In this instance, the logic conditions can be set as required in advance by the wiring of the internal circuits of each of the logical product and logical summation gate arrays. In other words, the logic conditions can be programmed.

In a PLA of this kind, however, a large number of switching elements are used, particularly in the logical product gate array. If the PLA is constituted by the bipolar type of active elements, therefore, an extremely large number of bipolar active elements must be formed as the switching elements. Even if IIL (Integrated Injection Logic) devices with a multi-electrode structure are used to reduce the number of elements, an extremely large number of elements are still necessary because the number of electrodes that can be formed on one IIL device is limited. In order to actuate an IIL device, a constant current called an "injection current" must always flow through all the IIL elements, so that the power consumption of the PLA as a whole is very large. Furthermore, as the size of the gate increases, the number of IIL device connected to each IIL device becomes greater. For this reason, the output capacity of each IIL device, that is, its "fan-out", must be increased with the result that the power consumption and size of each IIL device must be further increased. This means that it is considered impossible in practical devices to obtain a large gate size with a PLA of this kind, because of this great increase in the power consumption and drop in the integration density.

The present invention is directed to solving these problems in the prior-art technique.

SUMMARY OF THE INVENTION

It is therefore an object of the present invention to provide a semiconductor integrated circuit technique which can be used to fabricate a PLA in which the gate structure can be expanded while both a lower power consumption and a higher integration density can be provided.

The above and other objects and novel features of the invention will become more apparent from the following description, taken in conjunction with the accompanying drawings.

The following is an outline of a typical embodiment of the invention disclosed herein.

In a semiconductor integrated circuit in which a PLA is formed, the present invention is characterized in that a logical product gate array of the PLA is formed of MIS active elements, and its logical summation gate array of bipolar active elements. Thus, the invention can accomplish the object of the expansion of the gate structure while accomplishing both a lower power consumption and a higher integration density of the PLA.

DESCRIPTION OF THE PREFERRED EMBODIMENTS

Figure 1:
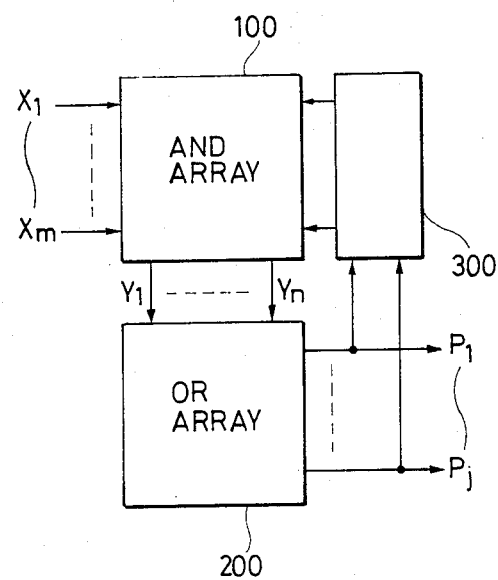
FIG. 1 is a block diagram of the PLA portion of a semiconductor integrated circuit in accordance with the presen invention.

Hereinafter, typical embodiments of the present invention will be described with reference to the accompanying drawings.

The same reference numerals are used throughout the drawings to identify identical or similar constituents.

FIG. 1 illustrates the outline of a PLA which is formed as an internal circuit of a semiconductor integrated circuit in accordance with the present invention.

The PLA shown in the drawing consists of a logical product gate array 100 and a logical summation gate array 200, a feedback circuit 300 is also provided if necessary.

The operation of the PLA is generally as follows. First of all, only AND (or NAND) operations are executed in the logical product gate array 100 on a plurality of logic inputs $X1-X_m$ applied externally to the PLA, then OR (or NOR) operations are executed in the logical summation gate array 200 on a plurality of logic outputs $Y1-Y_n$ produced from the logical product gate array 100. Logical outputs $P1-P_j$ satisfying predetermined logic conditions can thus be obtained from the logical summation gate array 200. In this case, the logic conditions can be set as desired by the wiring conditions of the internal circuits of each of the logical product gate array 100 and the logical summation gate array 200. In other words, the PLA can be programmed.

The feedback circuit 300, which is provided if necessary, consists of feedback registers and feeds back part of the logical outputs P1-P$_j$ to a logical input of the AND gate array 100. Thus, a holding operation, such as a shift in the logic conditions on the basis of a specific logic state, for example, can be carried out.

Figure 2:
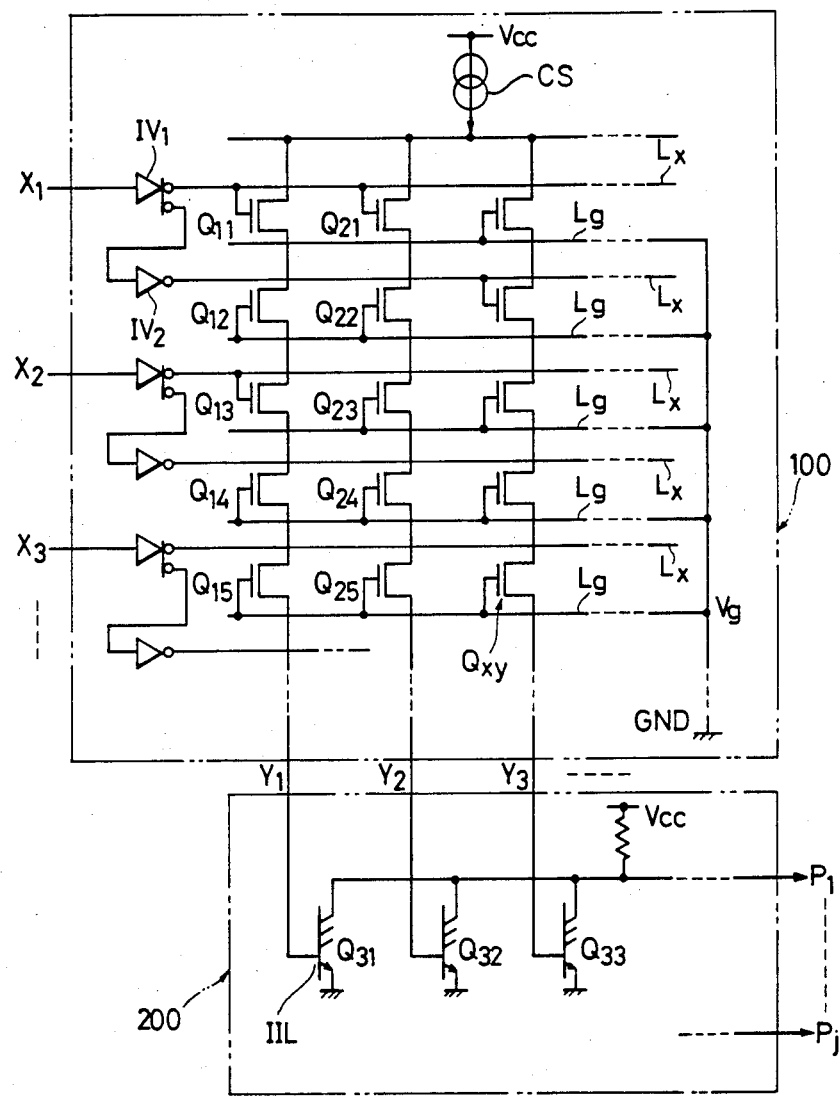
FIG. 2 is a circuit diagram of the logical product array and logical summation array portions of the PLA of FIG. 1.

FIG. 2 shows part of the internal circuit of the PLA described above. Before going into detail regarding this circuit, an outline of the semiconductor integrated circuit shown in the drawing will be given first.

In a semiconductor integrated circuit in which a PLA consisting of a logical product (AND or NAND) gate array 100 and a logical summation (OR on NOR) gate array 200 is formed, the semiconductor integrated circuit shown in FIG. 2 is characterized in that the logical product gate array 100 is formed as a vertical structure of MIS (Metal-Insulator-Silicon) active elements, while the logical summation gate array 200 is formed as a transverse structure of bipolar active elements. The term "vertical structure" means an arrangement of FIG. 2 of a NAND construction using negative logic in which the elements are connected in series, while the term "transverse type" means an arrangement of a NOR construction in which the elements are connected in parallel. These terms could also apply to corresponding AND and OR positive logic structure with respective series and parallel connection.

The logic of the logical summation gate array 200 is generated by wired ORs (or NORs). MOS field-effect transistors are used for the MIS active elements, while IIL devices are used as the bipolar active elements. The input circuit of the logical product gate array 100 and the output circuit of the logical summation gate array 200 are each composed of bipolar active elements, to obtain compatibility in input and output levels with respect to other bipolar semiconductor integrated circuits.

This PLA described above will now be described specifically.

In the drawings, the logical product gate array 100 consists of a large number of p-channel depletion MOS field-effect transistors $Q_{11}$, $Q_{12}$, $Q_{13}$, $Q_{14}$, $Q_{15}$ . . . $Q_{21}$, $Q_{22}$, $Q_{23}$, $Q_{24}$, $Q_{25}$ . . . The transistors $Q_{11}$ through $Q_{25}$ are arranged in a matrix consisting of columns and rows, forming a so-called vertical-structure MOS array. The MOS field effect transistors $Q_{xy}$ ($Q_{11}$ through $Q_{25}$, and the like) are connected in series for each column, forming a so-called "vertical type".

The logical summation gate array 200 is formed by arranging transversely a large number of invert bipolar transistors of a multiple electrode structure IILQ$_{31}$, Q$_{32}$, Q$_{33}$ . . . As used herein, an "ineverted" transistor operates with a nominal collector region acting as an emitter and in which the net flow of minority carriers is from the nominal collector region tothe base region as is well known as, for example, stated in the SAMS "Modern Dictionary of Electronics", Sixth Edition, Rudolf F. Graf, 1984, p. 518. Logic outputs Y1, Y2, Y3 . . . from the logical product gate array 100 are applied to the bases of the IIL devices. A wired OR circuit is formed by a combination of the collectors of any of the IIL devices of a multiple electrode structure, that is, on the multicollector side, so as to execute a NOR operation.

In the logical product gate array 100 described above, a plurality of logical inputs $X_1$, $X_2$, $X_3$ . . . at IIL level are each sorted into non-inversion signals and inversion signals by IIL inverters IV$_1$, IV$_2$ provided therefor, and are input to the gates of the corresponding MOS field-effect transistors ($Q_{11}$, $Q_{21}$, $Q_{13}$, $Q_{27}$) that have been selected for each row, through signal lines $L_x$ extending in the X direction. The selected MOS field-effect transistors are subjected to on/off control depending upon whether the corresponding signal line $L_x$ is at high level or at low level. The gates of the MOS field-effect transistors ($Q_{12}$, $Q_{22}$, $Q_{23}$, $Q_{14}$, $Q_{24}$, $Q_{15}$, $Q_{25}$, $Q_{26}$, $Q_{28}$, $Q_{29}$, $Q_{30}$) which are not selected are connected to a pseudo-logic level $V_g$ (ground level) by pseudo-signal lines $L_g$ extending in the X direction and the nonselected MOS field-effect transistors are always kept on.

Each row of the vertical MOSFET array is connected at one end to the other rows, and the common junction point thereof is connected to a power source $V_{cc}$ through a constant current circuit CS (or a pull-up resistor). The other end of each row is connected as a terminal for the corresponding AND output Y$_1$, Y$_2$, Y$_3$ . . . to a logical input of the logical summation gate array 200. Accordingly, when all the MOS field-effect transistors in a particular row are turned on, that is, when a predetermined AND condition is satisfied in that row, the whole row is conductive, and a high logic level output, that is, "H", appears at the other end of that row because of the potential of the power source $V_{cc}$. These outputs are applied to the bases the corresponding IIL devices ($Q_{31}$, $Q_{32}$, $Q_{33}$, . . . ) for the OR operations within the logical summation gate array 200.

Consider the MOS field-effect transistors $Q_{11}$, $Q_{12}$, $Q_{13}$, $Q_{14}$, $Q_{15}$, . . . in the far left row of FIG. 2. The gate of the selected MOS field-effect transistor $Q_{11}$ is connected to the inversion signal of the logical input X$_1$, and the gate of the selected MOS field-effect transistor $Q_{13}$ is connected to the inversion signal of the logical input X2, through the corresponding signal lines $L_x$. On the other hand, the gates of the other, non-selected MOS field-effect transistors $Q_{12}$, $Q_{14}$, $Q_{15}$ . . . are connected to the pseudo-logic level $V_g$ through the corresponding pseudo-signal lines $L_g$, and these transistors are normally kept on. In this case, therefore, the gate input of each MOS field-effect transistor $Q_{11}$, $Q_{12}$, $Q_{13}$, $Q_{14}$, $Q_{15}$ . . . in that row drops to "L" level (low logic level) when both logical inputs X1 and X2 rise to "H" level (high logic level), and the MOS field-effect transistors $Q_{11}$, $Q_{12}$, $Q_{13}$, $Q_{14}$, $Q_{15}$ . . . in that row are all turned on, so that the level of the logical output Y1 at the other end of that row rises to "H". In other words, the logical output Y1 becomes "H" under the logical condition that the logical product of the logical outputs X1 and X2 is 1.

Consider the MOS field-effect transistors $Q_{21}$, $Q_{22}$, $Q_{23}$, $Q_{24}$, $Q_{25}$ . . . of the second row from the left. In this row, the gate of the MOS field-effect transistor $Q_{21}$ is connected to the inversion signal of the logical input X1 through the signal line $L_x$, while the gates of the other MOS field-effect transistors $Q_{22}$, $Q_{23}$, $Q_{24}$, $Q_{25}$ are connected to the pseudo-signal lines $L_g$. In this case, therefore, the gate input of each of the MOS field-effect transistors $Q_{21}$, $Q_{22}$, $Q_{23}$, $Q_{24}$, $Q_{25}$ . . . in that row is "L" (low logic level) when the logical input X1 is "H" (high logic level), and the p-channel normally-off MOS field-effect transistors $Q_{21}$, $Q_{22}$, $Q_{23}$, $Q_{24}$, $Q_{25}$ . . . in that row are all turned on. Accordingly, the level of the logical output Y2 at the other end becomes "H". In other words, the logical output Y2 becomes 1 or "H" in this row under the logical condition that the logical input X1 is 1.

A predetermined logical condition can be set for each row in this manner. In this embodiment, the logical conditions can be set as required by selecting which of the signal lines $L_x$ and the pseudo-signal lines $L_g$ the gates of the individual MOS field-effect transistors should be connected to.

The pseudo-signal level $V_g$ connected to the pseudo-signal lines $L_g$ is set to a level which is equivalent to the "L" level of the logical inputs X1, X2, X3 . . . connected to the signal lines $L_x$. In other words, the pseudo-signal level $V_g$ is determined so that the on-resistance of the MOS field-effect transistors, which are turned on by an "L" signal applied through the signal lines $L_x$, is equal to the on-resistance of the MOS field-effect transistors which are turned on by the pseudo-signal level $V_g$ applied through the pseudo-signal lines $L_g$. This pseudo-signal level $V_g$ can be obtained easily by connecting, for example, the pseudo-signal lines $L_g$ to ground GND in this embodiment.

As described above, the nonselected MOS field-effect transistors, which are not turned on and off by the logical inputs, are kept on by the pseudo-signal level $V_g$ which is equivalent to the "L" level of the logical inputs, so that the sum of the on-resistance of the MOS field-effect transistors in each row can be set to the same level, irrespective of the number of the nonselected MOS transistors therein. Accordingly, the driving current supplied to the bases of the OR gate array IIL devices from the other end of each row can always be supplied in order to any of the rows, whatever the logical conditions set for each row. This arrangement makes it possible to stably drive the NOR gate array 200 consisting of IIL devices which are current-driven elements, by use the of the AND gate array 100 consisting of MOS field-effect transistors which are voltage-driver elements. It is thus possible to construct that portion of the AND gate array 100 which needs a large number of switching elements of MOS field-effect transistors, and to realize a PLA with an overall lower power consumption. Furthermore, the PLA can be formed more easily within a bipolar type of semiconductor integrated circuit, and the PLA can be fabricated easily within a semiconductor integrated circuit in which analog circuits are formed. In other words, this embodiment can be applied to a semiconductor integrated circuit in which there are both analog circuits and digital circuits.

The signal lines $L_x$ and the pseudo-signal lines $L_g$ can be formed easily and to a high density by using a semiconductor integrated circuit with a two-layer wiring structure, as will be illustrated in examples below.

Figure 3:
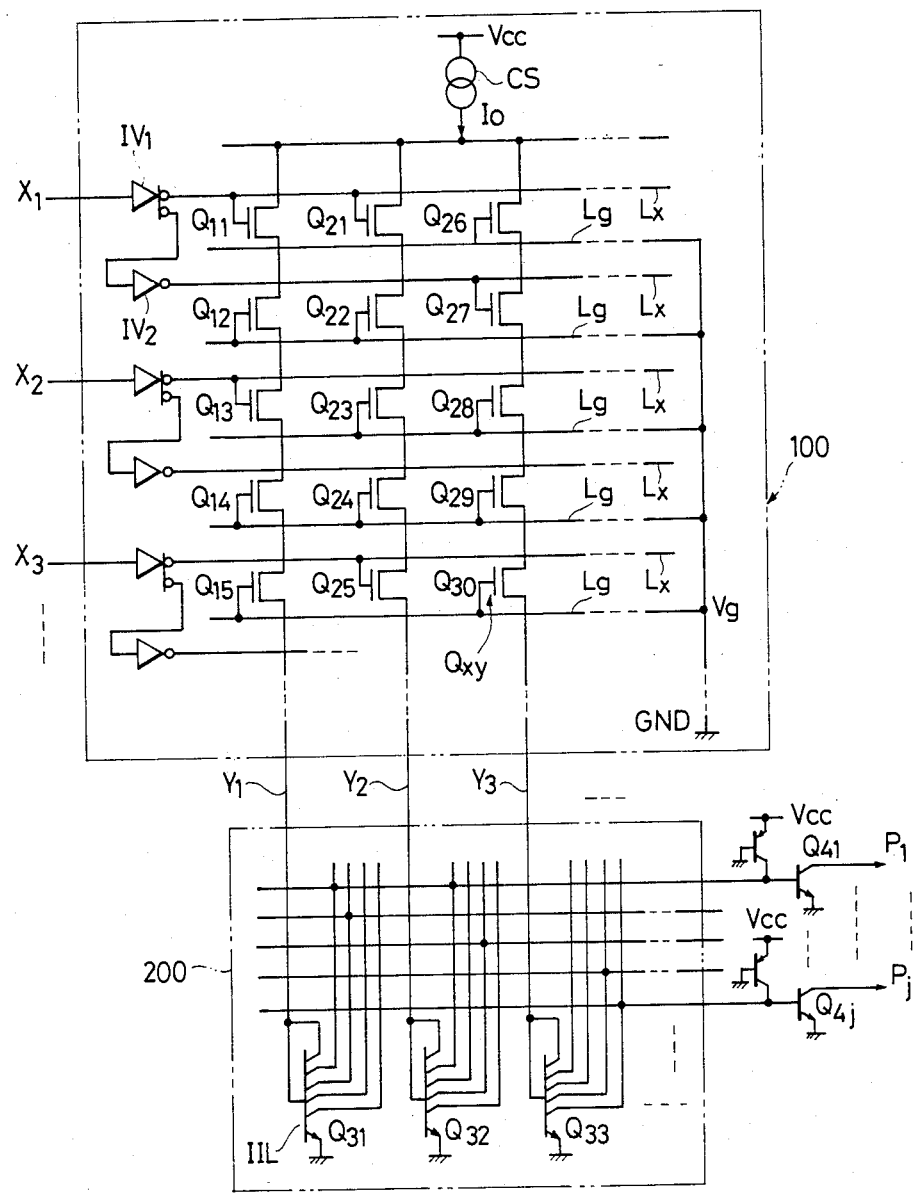
FIG. 3 is a circuit diagram of a modified embodiment of the embodiment of FIG. 2.

FIG. 3 is a circuit diagram of a PLA in accordance with a modified embodiment of FIG. 2. The circuit of this Figure differs from that of FIG. 2 in the following points:

(1) The method of driving the gate electrodes of the MOS field-effect transistors $Q_{11}$, $Q_{12}$ . . . $Q_{30}$ is devised so that only one of the logical output signals Y1, Y2 and Y3 of the AND array 100 reaches "H" (high logic level) in response to a specific combination of logical input signals X1, X2 and X3.

(2) A wired OR circuit is formed by the multi-collectors of the backward bipolar transistors $Q_{31}$, $Q_{32}$ and $Q_{33}$ that respond to the logical output signals Y1, Y2 and Y3 of the AND array 100, and this wired OR signal is inverted by bipolar transistors $Q_{41}$ through $Q_{4j}$, although this is not particularly limited thereto, to provide final output signals $P_1$ through $P_j$.

In this PLA, of the logical outputs $Y_1$, $Y_2$, $Y_3$ . . . of the AND (or NAND) array 100, only one reaches "H" (high logic level). In other words, the transistors of only one of the rows of the vertical MOS array are all turned on. Therefore, the current needed for the operation is always a current $I_o$ which is determined by a constant-current source CS, regardless of how much the capacity of the PLA increases. The current $I_o$ can be as small as between 10 to 20 $\mu$A, and the power consumption is also extremely small.

A vertical array is employed as the MOS array structure 100, but its operating speed is lower than that of a transverse MOS array. However, the device size can be reduced and a higher integration is possible therewith, so that a lower power consumption and a higher integration can be accomplished with the AND (or NAND) array 100.

As described already, each row of the vertical MOS array 100 is constructed so that its on-resistance is constant. For this reason, the operating current of the IIL devices constituting the OR (or NOR) array 200 is constant without any variation when any of the rows is turned on, and no drop in speed, or erroneous operation, etc., due to variations in the operating current occur. The operating current of the IIL devices remains constant in any row, regardless of how the wiring of the AND matrix 100 changes.

As described above, that portion of the logical product gate array 100 which would otherwise require a large number of switching elements is constituted of a vertical structure of MOS field-effect transistors, while the logical summation gate array 200 is constituted by IIL devices in a transverse structure, so that the constant-current source CS of the logical product gate array portion 100 can be made common, and the current $I_o$ from the constant-current source CS can be effectively supplied as a base-driving current to the IIL devices of the logical summation gate array 200, from the logical product gate array 100. Accordingly, the current consumed by the OR array 200 can be as low as only 10 to 20 $\mu$A, regardless of how many bits the inputs Y1–Y3 have, and a PLA of which the gate structure has been expanded can be formed while achieving a low power consumption. The constant-current source CS is provided to stabilize the operating current of the IILs devices, but the source of each MOSFET can be connected directly to $V_{cc}$ without providing any constant-current source CS.

Figure 10:
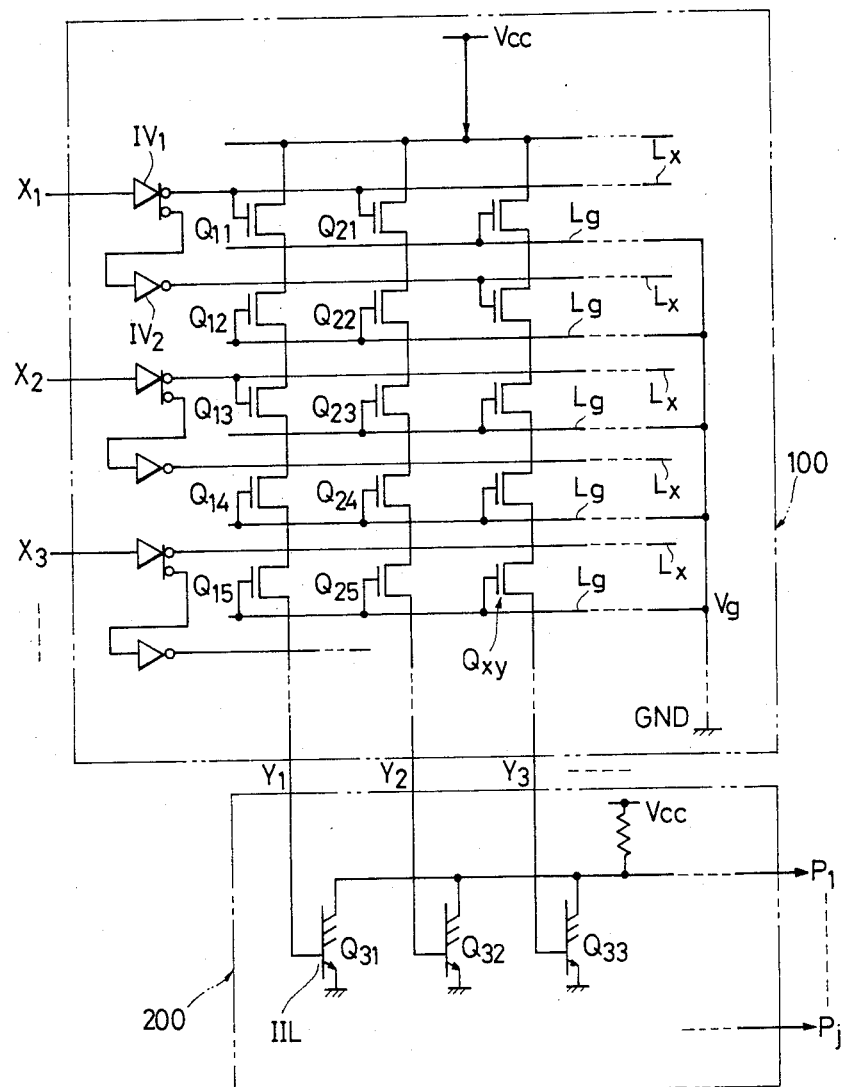
FIG. 10 is a modification of the embodiment of FIG. 2.

FIG. 10 illustrates modification of FIG. 2 with the only difference being the deletion of the constant current source.

Since the logical product gate array 100 of the PLA is constituted by MOS field-effect transistors in a vertical structure, the integration density of the logical product portion can be easily increased, and hence the overall integration density of the PLA can be improved dramatically.

Since the logic of the logical summation gate array 200 is constituted by wired ORs (or NORs) using the multi-collectors of IIL devices, the integration density of the logical summation gate array portion 200 can also be increased easily, and a low power consumption and a high integration density can also be achieved for the logical summation gate array portion 200. A described above, if specific attention is paid to power consumption, the present invention provides an extremely good advantage that, however great the bit capacity of the signals X1, X2, X3 . . . Y1, Y2, Y3, the power consumption does not increase, provided that a drop in the speed of each of the AND array 100 and the OR array 200 is acceptable.

Since the input circuit of the logical product gate array 100 and the output circuit of the logical summation gate array 200 are each composed of IIL devices, the PLA in accordance with this embodiment can be made to be IIL-compatible and can be connected directly to other IIL devices. When a large-scale logic device is assembled, it is thought possible to employ IIL devices which can provide a high degree of integration for logic circuits other than PLAs, such as flip-flop circuits. Therefore, if a PLA could be interfaced to an IIL device, it would provide a large advantage.

In the manner described above, the present invention can realize a large-scale PLA with a low power consumption and a high integration density.

The present invention provides another effect in that the MOS transistors constituting the AND array are voltage-driven devices which are driven by voltages applied to the gates thereof. In other words, the input level to the PLA is considered in terms of the IIL level in the embodiment above, but basically this level could be any level. Assume that the level used is TTL (transistor-transistor logic) level. If the AND array 100 is constructed of bipolar transistors, the bases of the bipolar transistors of the AND array 100 are driven strongly by the transistors of the TTL collector-ground output stage, so that the driving input current is large there. Since the MOS transistors are voltage-driven devices, the input current does not flow therethrough, and so the power consumption in that stage is extremely low.

Thus the PLA in accordance with the present invention can be freely interfaced to any other circuit, particularly circuits consisting of bipolar devices such as IIL, TTL, or other devices, and the power consumption can be reduced because the transistors in the input stage (the transistors constituting the AND array) are voltage-driven devices and the driving input current does not flow therethrough.

Incidentally, the logical product gate array 100 described above can be constructed easily and to a high integration density by the use of a semiconductor integrated circuit of a two-layered wiring structure, as will be illustrated by later embodiments.

FIGS. 4 through 9 illustrate one embodiment of the process of fabricating a semiconductor integrated circuit provided with the PLA described above.

FIGS. 4 through 8 illustrate the portion of the logical product gate array 100, particularly the portion corresponding to the MOS field-effect transistors $Q_{11}$, $Q_{12}$, $Q_{13}$, $Q_{14}$... in the leftmost row. The fabrication process will now be described step-by-step, with reference to FIGS. 4 through 8.

Figure 4:
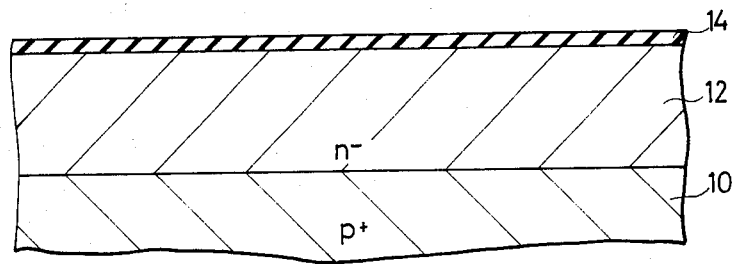
FIG. 4 is a section showing part of a semiconductor substrate worked in preparation for the fabrication of semiconductor integrated circuit including the PLA of FIG. 2.

FIG. 4 illustrates a piece of semiconductor starting material which has been worked in advance to provide a semiconductor integrated circuit including the PLA described above. The semiconductor starting material shown in the drawing consists of a $p^+$-type silicon semiconductor substrate into which a p-type impurity is doped to a high concentration, and an $n^-$-type silicon epitaxial layer 12 into which an n-type impurity is doped to a low concentration, and which is formed on the surface of the substrate 10. The surface of the epitaxial layer 12 is covered with, and protected by, an oxide film 14 or the like.

Figure 5:
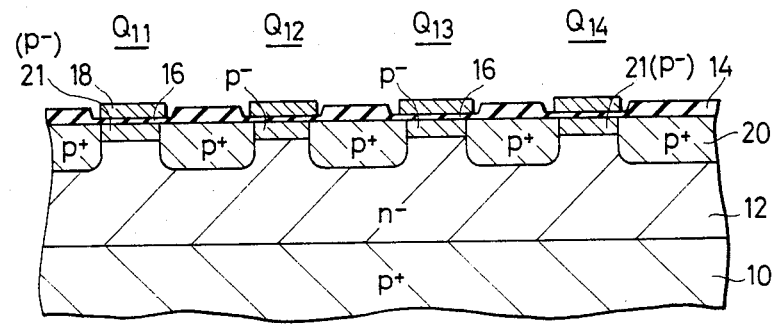
FIG. 5 is a section showing how MOS field-effect transistors constituting part of the logical product gate array have been formed.

FIG. 5 illustrates the state after $p^+$-type diffusion layers 20 formed by the selective diffusion of a p-type impurity to a high concentration, $p^-$-type channel layers 21, a gate oxide film 16, and gate electrodes 18 have been formed on the semiconductor starting material of FIG. 4. This forms a large number of p-channel depletion MOS field-effect transistors $Q_{11}$, $Q_{12}$, $Q_{13}$, $Q_{14}$.... The $p^+$-type diffusion layers 20 are formed in common for the source and drain regions of adjacent MOS field-effect transistors. Accordingly, the MOS field-effect transistors $Q_{11}$, $Q_{12}$, $Q_{13}$, $Q_{14}$... are connected in series in the row direction (laterally in FIGS. 4 through 8).

Figure 6:
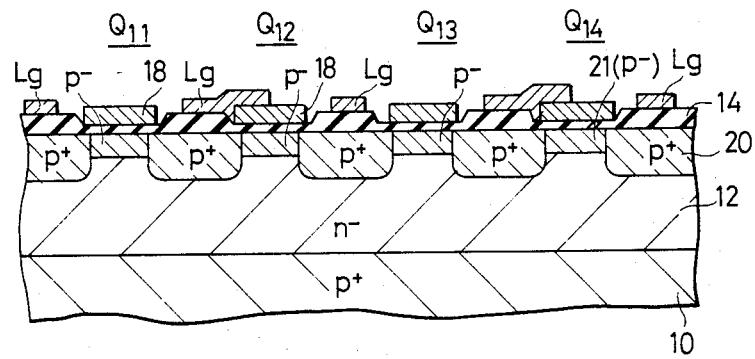
FIG. 6 is a section showing how the first layer of wiring is formed on the device of FIG. 5.

The pseudo-signal lines $L_g$ made of aluminum or the like are then provided in the gaps between the gate electrodes of adjacent MOS field-effect transistors $Q_{11}$, $Q_{12}$, $Q_{13}$, $Q_{14}$..., as shown in FIG. 6. The lines extend in the column direction (in the direction perpendicular to the paper in FIGS. 4 through 7). One end of each pseudo-signal line $L_g$ is connected to ground potential GND (not shown in the drawing). The gate electrodes 18 of the so-called "nonselected" MOS field-effect transistors $Q_{12}$ and $Q_{14}$, which are not driven to turn on and off by a logical input, are connected to the pseudo-signal lines $L_g$ by extensions of side portions of these lines $L_g$ which are brought into contact with the corresponding gate electrodes 18 from above.

In this manner, the first layer of wiring for the pseudo-signal lines $L_g$ is completed.

Figure 7:
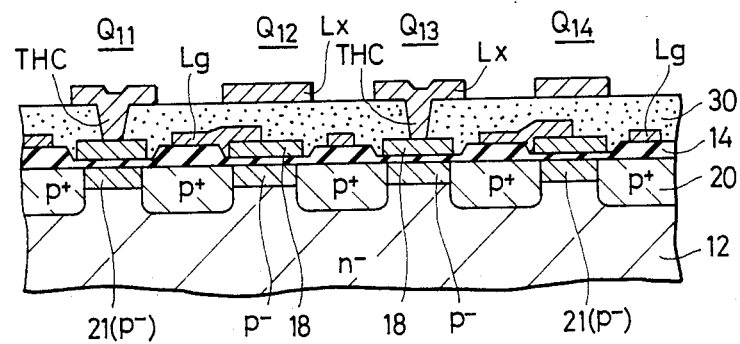
FIG. 7 is a section showing the how the second layer of wiring is formed on the device of FIG. 6.

An inter-layer insulator layer 30 of a polyimide resin, for example, is then provided as shown in FIG. 7, and the second layer of wiring of aluminum or the like is arranged thereover. The logic signal lines $L_x$ connected to the logical input extend in the column direction (in the direction perpendicular to the paper in FIGS. 4 through 7). The gate electrodes 18 of the MOS field-effect transistors $Q_{11}$ and $Q_{14}$, which are driven to turn on and off by the logical input, are connected to the signal lines $L_x$ by through-hole contacts THC.

Figure 8:
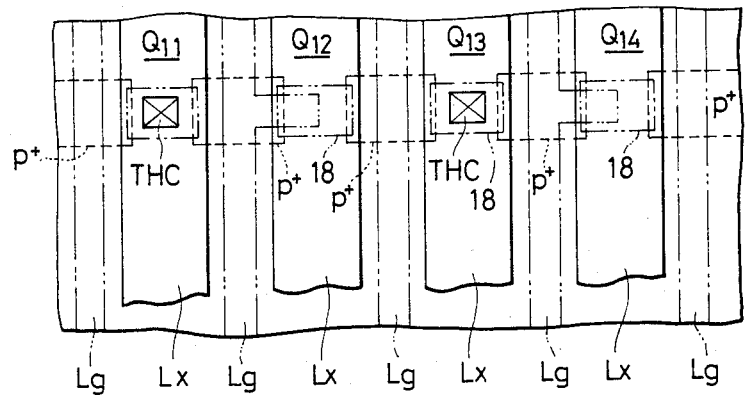
FIG. 8 is a plan view of the layout of the portion shown in FIG. 7.

FIG. 8 is a plan view of the portion shown in FIG. 7.

In this manner, a PLA portion using MOS field-effect transistors is formed in the logical product gate array 100.

Figure 9:
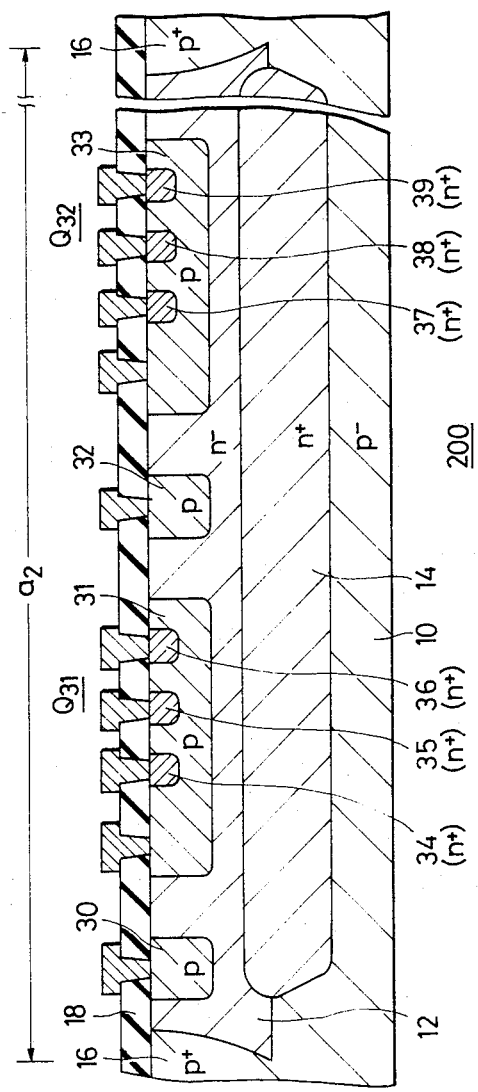
FIG. 9 is a section showing the bipolar transistors constituting the gate array 200 of the PLA.

FIG. 9 is a section through the structure of inverted IIL bipolar transistors $Q_{31}$ and $Q_{32}$ forming the NOR gate array 200 of the PLA of FIG. 2. An $n^+$-type buried layer 14 is formed on the $p^-$-type silicon semiconductor substrate 10, and the $n^-$-type silicon epitaxial layer 12 is then formed over the substrate 10. A device-formation region a2 is defined by the provision of a $p^+$-type isolation layer 16 in the epitaxial layer 12. A plurality of p-type regions 30, 31, 32 and 33 are formed in the device-formation region a2, $n^+$-type regions 34, 35 and 36 are formed in the p-type region 31, and $n^+$-type regions 37, 38 and 39 are formed in the p-type region 33.

The $n^+$-type buried layer 14 and the $n^-$-type epitaxial layer 12, the p-type region 31, and the plurality of $n^+$-type regions 34, 35 and 36 function as the emitter region, base region and multicollector region respectively, of the inverted npn transistor $Q_{31}$.

The $n^+$-type buried layer 14, and the $n^-$-epitaxial layer 12, the p-type region 33, and the plurality of $n^+$-type regions 37, 38 and 39 function as the emitter region, base region, and multicollector region, respectively, of the inverted npn transistor $Q_{32}$.

This embodiment of the invention as described above provides the following advantageous effects.

(1) The logical product gate array 100 of the PLA is constructed in a vertical form by MIS active elements, while the logical summation gate array 200 of the PLA is constructed in a transverse form by bipolar active elements such as IIL devices. This construction makes it possible to provide a common current source CS for the logical product gate array 100, and supply the current $I_o$ efficiently from the current source CS as a driving current from the logical product gate array 100 to the bipolar active devices of the logical summation gate array 200. Accordingly, a PLA enabling an expansion of the gate size can be formed, while providing a low power consumption.

(2) Since the logical product gate array 100 of the PLA is constructed in a vertical form by MIS active devices, the integration density of the logical product gate array 100 can be easily increased, so that the integration density of the PLA as a whole can be greatly improved.

(3) The logic of the logical summation gate array 200 is formed by wired ORs (or NORs) utilizing the multicollectors of IIL devices. Accordingly, the integration density of the logical summation gate array portion can be easily increased, so that a low power consumption and a high integration density can also be provided for the logical summation gate array portion 200.

(4) The input circuit of the logical product gate array 100 and the output circuit of the logical summation gate array 200 are each constructed of bipolar active elements. Accordingly, compatibility with other circuits, particularly with bipolar semiconductor integrated circuits, can be provided from the point of view of input or output levels.

(5) Since the logical product gate array 100 is constructed of voltage-driven MISFETs, no driving input current flows when the circuit of the present invention is connected to a bipolar circuit such as a TTL circuit, and power consumption in that stage can thus be reduced.

Because of (1) through (5) above, the present invention can provide a synergistic effect in that the expansion of the gate size of the PLA can be accomplished with a low power consumption and a high integration density.

Although the present invention has been described in detail with reference to some preferred embodiments thereof, it must be understood that the invention is not particularly limited thereto, but can be practised in various modified forms without departing from the spirit and scope thereof. For instance, both the input circuit of the logical product gate array 100 and the output circuit of the logical summation gate array 200 may be constructed of MIS active elements. In such a case, since the output circuit consists of MISFETs, the power consumption can be further reduced. The pseudo-signal lines can be formed by utilizing wiring made of polycrystal line silicon together with the gate electrodes of the MOS field-effect transistors. In such a case, the PLA can be formed with a single-layered aluminum wiring structure. When n-channel MOS field-effect transistors are used, the pseudo-signal lines are connected to the power source potential, and the pseudo-signal level can be taken from the source or drain potential of each MOS field-effect transistor. Each nonselected MOS field-effect transistor, could be kept constantly on by short-circuiting its source and drain, or it can be formed by implanting an impurity into a channel portion by ion implantation so that a channel is formed therebetween.

The present invention is not particularly limited to the technique of fabricating a PLA in a semiconductor integrated circuit which is the field of utilization of the invention and is used as the background thereof, and on which the description of the present invention has mainly been based. For example, the present invention can also be applied to an integrated circuit formed by arranging a large number of logic elements on a semiconductor chip, such as a microcomputer or a signal processor of a logical gate array in a master slice, besides a PLA.

What is claimed is:

1. A semiconductor integrated circuit comprising a programmable logic array which includes a logical product gate array having a plurality of inputs to which a plurality of input signals are applied, and a logical summation gate array to which a plurality of output signals from said logical product gate array are applied, and having an output wherein said logical product gate array is comprised of a plurality of MIS field-effect transistors having gates each coupled to one of the inputs for selectively driving said gates and having source-drain paths which are each coupled in series between a potential source and an output providing one of the output signals, and said logical summation gate array is provided with a plurality of inverted bipolar transistors each having a base which is driven by a separate one of said output signals and the collector-emitter paths are connected parallel to one another and between said output and a potential source.

2. The semiconductor integrated circuit as defined in claim 1, wherein said logical summation gate array further is comprised of non-selected field-effect transistors with the gates of the nonselected field-effect transistors of said plurality of MIS field-effect transistors being connected to a fixed potential.

3. The semiconductor integrated circuit as defined in claim 1, wherein a plurality of said inverted bipolar transistors have a multicollector structure, and selected collectors of said multicollector are connected to one another.

4. The semiconductor integrated circuit as defined in claim 1, wherein said logical product gate array includes an input circuit comprised of bipolar transistors for coupling said input signals to the gates of the selected MIS field effect transistors of said logical product gate array.

5. The semiconductor integrated circuit as defined in claim 4, wherein said input circuit is comprised of integrated injection logic inverters.

6. The semiconductor integrated circuit as in claim 3 further comprising a constant current source connected to each of the series connections of the source and drain paths.

7. The semiconductor integrated circuit as in claim 3 further comprising a power source connected to each of the series connections of the source and drain paths.

8. The semiconductor integrated circuit as in claim 6 wherein the logical summation gate array is comprised of AND gates.

9. The semiconductor integrated circuit as in claim 7 wherein the logical summation gate array is comprised of AND gates.

* * * * *